(12) United States Patent
Jo

(10) Patent No.: US 7,924,457 B2
(45) Date of Patent: Apr. 12, 2011

(54) ELECTRO-OPTICAL DEVICE THAT INCLUDES A PLURALITY OF DRIVING TRANSISTORS TURNED ON AND OFF IN ACCORDANCE WITH A PLURALITY OF PULSE WIDTH MODULATION SIGNALS

(75) Inventor: Hiroaki Jo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 1138 days.

(21) Appl. No.: 11/618,287

(22) Filed: Dec. 29, 2006

(65) Prior Publication Data

US 2007/0212078 A1 Sep. 13, 2007

(30) Foreign Application Priority Data

Mar. 8, 2006 (JP) ................................. 2006-062160

(51) Int. Cl.
*G06F 15/00* (2006.01)
*H04B 10/00* (2006.01)
(52) U.S. Cl. ........................................ 358/1.7; 398/189
(58) Field of Classification Search .................. 358/1.1, 358/1.7, 1.13, 1.15, 474, 400, 500; 323/288, 323/283, 282, 351; 332/107, 110, 108, 112, 332/113; 398/140, 189
See application file for complete search history.

(56) References Cited

U.S. PATENT DOCUMENTS

| | | | | |
|---|---|---|---|---|
| 6,775,764 | B1 * | 8/2004 | Batcher | 712/227 |
| 7,446,517 | B2 * | 11/2008 | Chen et al. | 323/284 |
| 7,688,009 | B2 * | 3/2010 | Bayadroun | 315/360 |
| 7,746,300 | B2 * | 6/2010 | Zhang et al. | 345/82 |
| 2006/0113974 | A1 * | 6/2006 | Kan et al. | 323/282 |
| 2006/0290337 | A1 * | 12/2006 | Lhermite et al. | 323/316 |

FOREIGN PATENT DOCUMENTS

JP A 2002-108285 4/2002

* cited by examiner

*Primary Examiner* — Gabriel I Garcia
(74) *Attorney, Agent, or Firm* — Oliff & Berridge, PLC

(57) ABSTRACT

An electro-optical device includes a plurality of driving transistors turned on or turned off in accordance with a plurality of pulse-width modulation signals. An electro-optical element is electrically connected to drains of the plurality of driving transistors and emits light at a luminance corresponding to a drive current. A data signal generator generates a data signal in accordance with a plurality of pieces of data such that, the logical level of the data signal corresponds to the logical level of the corresponding pulse-width modulation signal for the corresponding section. Pulse-width modulation signal generators are provided for each respective driving transistors.

5 Claims, 12 Drawing Sheets

ELECTRO-OPTICAL DEVICE THAT INCLUDES A PLURALITY OF DRIVING TRANSISTORS TURNED ON AND OFF IN ACCORDANCE WITH A PLURALITY OF PULSE WIDTH MODULATION SIGNALS

The entire disclosure of Japanese Application No. 2006-062160, filed Mar. 8, 2006 is expressly incorporated by reference herein.

BACKGROUND

1. Technical Field

The present invention relates to signal transmission methods for transmitting pulse-width modulation signals, drive circuits, electro-optical devices, and electronic apparatuses.

2. Related Art

In printers used as image forming apparatuses, a light-emitting device including many light-emitting elements arranged in an array is used as a head device for forming electrostatic latent images on an image carrier, such as a photosensitive drum. Such a head device is usually formed of a plurality of light-emitting elements arranged in a line in a main-scanning direction. In addition, light-emitting diodes, such as organic light-emitting diodes (hereinafter, may be referred to as "OLEDs"), are widely used as light-emitting elements.

A head device includes a plurality of pixel circuits and a drive circuit that are provided on a substrate. Each of the pixel circuits includes an OLED element and a driving transistor provided near the OLED element for supplying a drive current to the OLED element. As a method for driving OLED elements, a PWM (pulse-width modulation) driving method is known (for example, see JP-A-2002-108285). In the PWM driving method, a constant current is supplied to an OLED element when a driving transistor is in an ON-state, and a grayscale level is determined in accordance with setting of an ON-state or an OFF-state.

In the PWM driving method, the grayscale level of an OLED element is determined in accordance with the pulse width of a pulse-width modulation signal. Thus, in order to increase the number of grayscale levels, it is necessary to reduce the width of a pulse. However, a reduction in the pulse width increases the operation frequency of a drive circuit.

In addition, since many OLED elements are provided in an optical head, wiring lines for transmitting many pulse-width modulation signals to driving transistors are required.

SUMMARY

An advantage of some aspects of the invention is that it reduces the operation frequency of a circuit and that enables a plurality of pulse-width modulation signals to be transmitted using a small number of wiring lines.

According to an aspect of the invention, a signal transmission method in which a transmitter generates a data signal by multiplexing a plurality of pieces of data and transmits the generated data signal to a receiver through a transmission channel and in which the receiver generates a plurality of pulse-width modulation signals corresponding to the plurality of pieces of data in accordance with the data signal includes generating, by means of the transmitter, the data signal in accordance with the plurality of pieces of data such that, at the beginning of each of a plurality of sections of the corresponding pulse-width modulation signals for which logical levels of the corresponding pulse-width modulation signals are set, the logical level of the data signal corresponds to the logical level of the corresponding pulse-width modulation signal for the corresponding section, wherein a transition between the plurality of sections is performed at a different timing for each of the plurality of pulse-width modulation signals; and generating, by means of the receiver, in each of a plurality of systems for generating the corresponding pulse-width modulation signals, the corresponding pulse-width modulation signal by latching the data signal at the beginning of the corresponding section for the corresponding system and holding the data signal until the beginning of the next section for the corresponding system.

As described above, a pulse-width modulation signal has a plurality of sections for which respective logical levels can be set, and a transition between the plurality of sections is performed at a different timing for each of a plurality of pulse-width modulation signals. A transmitter generates a data signal such that the logical level of the data signal corresponds to the logical level of the pulse-width modulation signal for the corresponding section. For example, when a pulse-width modulation signal A has a section 1 starting at time t1 and ending at time t3, a section 3 starting at time t3 and ending at time t5, and a section 5 starting at time t5 and a pulse-width modulation signal B has a section 2 starting at time t2 and ending at time t4, a section 4 starting at time t4 and ending at time t6, and a section 6 starting at time t6. In this case, the logical level of the data signal at time t1, which is the time at the beginning of the section 1, at time t3, which is the time at the beginning of the section 3, and at time t5, which is the time at the beginning of the section 5, corresponds to the logical level of the pulse-width modulation signal A, and the logical level of the data signal at time t2, which is the time at the beginning of the section 2, at time t4, which is the time at the beginning of the section 4, and at time t6, which is the time at the beginning of the section 6, corresponds to the logical level of the pulse-width modulation signal B. A receiver latches the data signal at the beginning of a corresponding section for a corresponding system and holds the data signal until the beginning of the next corresponding section for the corresponding system. Thus, a pulse-width modulation signal can be generated. In the above-described example, in a system for generating the pulse-width modulation signal A, the data signal is latched at time t1, which is the time at the beginning of the section 1, and held until time t3, which is the time at the beginning of the section 3, the data signal is latched at time t3 and held until time t5, which is the time at the beginning of the section 5. Then, the processing is repeated. Accordingly, in order to generate a data signal by multiplexing a plurality of pieces of data, the logical levels of the plurality of pulse-width modulation signals are designated. Thus, the plurality of pulse-width modulation signals can be transmitted through a transmission channel. Moreover, a data signal is not generated only by multiplexing a plurality of pieces of data. Since the logical level at the beginning of a section of a pulse-width modulation signal is designated using a data signal, the receiver is capable of easily generating a pulse-width modulation signal.

It is preferable that each of the plurality of pieces of data include a plurality of bits and that the length of each of the plurality of sections of the pulse-width modulation signals be set in association with the weight of the corresponding bit. A pulse-width modulation signal indicates information using a pulse width. When the weight of a bit is set in association with the length of a section, a data signal can be generated by rearranging bits of a plurality of pieces of data.

According to another aspect of the invention, a drive circuit that drives a circuit including a plurality of driving transistors turned on or turned off in accordance with a plurality of pulse-width modulation signals each having a plurality of sections for which respective logical levels are set and an electro-optical element that is electrically connected to drains of the plurality of driving transistors and that emits light at a luminance corresponding to a drive current acquired by combining currents supplied from the plurality of driving transistors includes a data signal generator that generates a data signal in accordance with a plurality of pieces of data such that, at the beginning of each of the plurality of sections of the corresponding pulse-width modulation signals, the logical level of the data signal corresponds to the logical level of the corresponding pulse-width modulation signal for the corresponding section; and a plurality of pulse-width modulation signal generators that are provided for the respective driving transistors, each of the plurality of pulse-width modulation signal generators generating a corresponding pulse-width modulation signal by latching the data signal at the beginning of a certain section of the pulse-width modulation signal to be supplied to the corresponding driving transistor and by holding the data signal until the beginning of the next section of the pulse-width modulation signal and supplying the generated pulse-width modulation signal to the corresponding driving transistor.

The number of grayscale levels that can be designated by a pulse-width modulation signal is determined in accordance with the width of the section having the shortest length from among a plurality of sections of the pulse-width modulation signal. If the width of a section is reduced in order to increase the number of grayscale levels, an operation frequency increases. However, a certain restriction is imposed on the operation frequency. According to an aspect of the invention, however, a plurality of pulse-width-modulated currents is supplied as a drive current to an electro-optical element. Thus, by individually adjusting the plurality of pulse-width-modulated currents, the number of grayscale levels can be increased while maintaining the operation frequency.

In addition, the logical levels of a plurality of pulse-width modulation signals are multiplexed into a data signal. Thus, a plurality of pulse-width modulation signals can be generated without increasing the number of wiring lines (transmission channels) through which the data signal is transmitted.

According to a further aspect of the invention, a drive circuit that drives a plurality of circuits each including a driving transistor that is turned on or turned off in accordance with a pulse-width modulation signal having a plurality of sections for which respective logical levels are set and that outputs a drive current and a plurality of electro-optical elements emitting light at luminances corresponding to the drive currents includes a data signal generator that generates a data signal in accordance with a plurality of pieces of data for driving the plurality of circuits such that, at the beginning of each of the plurality of sections of the corresponding pulse-width modulation signals, the logical level of the data signal corresponds to the logical level of the corresponding pulse-width modulation signal for the corresponding section; and a plurality of pulse-width modulation signal generators that are provided for the respective circuits, each of the plurality of pulse-width modulation signal generators generating a corresponding pulse-width modulation signal by latching the data signal at the beginning of a certain section of the pulse-width modulation signal to be supplied to the corresponding driving transistor and by holding the data signal until the beginning of the next section of the pulse-width modulation signal and supplying the generated pulse-width modulation signal to the corresponding driving transistor.

Accordingly, since the logical levels of a plurality of pulse-width modulation signals are multiplexed into a data signal, a plurality of pulse-width modulation signals can be generated without increasing the number of wiring lines (transmission channels) through which the data signal is transmitted. Furthermore, a data signal is not generated only by multiplexing a plurality of pieces of data. Since the logical level at the beginning of a section of a pulse-width modulation signal is designated using a data signal, the pulse-width modulation signal generator is capable of easily generating a pulse-width modulation signal. The pulse-width-modulated currents may have the same amplitudes. Alternatively, the pulse-width modulated currents may have different amplitudes.

According to a still further aspect of the invention, an electro-optical device includes a plurality of driving transistors turned on or turned off in accordance with a plurality of pulse-width modulation signals each having a plurality of sections for which respective logical levels are set; an electro-optical element electrically connected to drains of the plurality of driving transistors and emitting light at a luminance corresponding to a drive current acquired by combining currents supplied from the plurality of driving transistors; a data signal generator generating a data signal in accordance with a plurality of pieces of data such that, at the beginning of each of the plurality of sections of the corresponding pulse-width modulation signals, the logical level of the data signal corresponds to the logical level of the corresponding pulse-width modulation signal for the corresponding section; and a plurality of pulse-width modulation signal generators that are provided for the respective driving transistors, each of the plurality of pulse-width modulation signal generators generating a corresponding pulse-width modulation signal by latching the data signal at the beginning of a certain section of the pulse-width modulation signal to be supplied to the corresponding driving transistor and by holding the data signal until the beginning of the next section of the pulse-width modulation signal and supplying the generated pulse-width modulation signal to the corresponding driving transistor.

Thus, by individually adjusting the plurality of pulse-width-modulated currents, the number of grayscale levels can be increased while maintaining the operation frequency. In addition, since the logical levels of a plurality of pulse-width modulation signals are multiplexed into a data signal, a plurality of pulse-width modulation signals can be generated without increasing the number of wiring lines (transmission channels) through which the data signal is transmitted.

It is preferable that each of the plurality of pieces of data include grayscale data representing the grayscale level of the electro-optical element and correction data for correcting the luminance of the electro-optical element. In this case, a drive current can be generated by combining a current based on the grayscale data and a current based on the correction data that are designated individually. Thus, variations in a threshold voltage of a driving transistor and in an electro-optical element can be corrected.

According to a still further aspect of the invention, an electro-optical device includes a plurality of driving transistors turned on or turned off in accordance with a plurality of pulse-width modulation signals each having a plurality of sections for which respective logical levels are set and outputting drive currents; a plurality of electro-optical elements provided for the respective driving transistors and emitting light at luminances corresponding the drive currents; a data signal generator generating a data signal in accordance with a plurality of pieces of data such that, at the beginning of each of the plurality of sections of the corresponding pulse-width modulation signals, the logical level of the data signal corresponds to the logical level of the corresponding pulse-width modulation signal for the corresponding selection; and a plurality of pulse-width modulation signal generators provided for the respective driving transistors, each of the plurality of pulse-width modulation signal generators generating a corresponding pulse-width modulation signal by latching the data signal at the beginning of a certain section of the pulse-width modulation signal to be supplied to the corresponding driving transistor and by holding the data signal until the beginning of the next section of the pulse-width modulation signal and supplying the generated pulse-width modulation signal to the corresponding driving transistor.

Thus, since the logical levels of a plurality of pulse-width modulation signals are multiplexed into a data signal, a plurality of pulse-width modulation signals can be generated without increasing the number of wiring lines (transmission channels) through which the data signal is transmitted. In this case, the pulse-width modulation signal generator also functions as a demultiplexer for separating information necessary for generating a pulse-width modulation signal from a data signal. In addition, since the logical level at the beginning of a section of a pulse-width modulation signal is designated using a data signal, the pulse-width modulation signal generator is capable of easily generating a pulse-width modulation signal.

In the electro-optical device described above, it is preferable that each of the plurality of pieces of data include a plurality of bits and that the data signal generator generate the data signal by rearranging the plurality of bits of the respective data. In this case, a data signal can be generated by rearranging bits.

In addition, in the electro-optical device described above, it is preferable that the length of each of the plurality of sections of the pulse-width modulation signals be set in association with the weight of the corresponding bit. A pulse-width modulation signal indicates information using a pulse width. When the weight of a bit is set in association with the length of a section, a data signal can be generated without performing special conversion.

An electronic apparatus according to an aspect of the invention includes the above-described electro-optical device. An image forming apparatus for printing images, such as a copying machine or a facsimile machine, a display for displaying images, a cellular phone, a personal computer, or the like may be used as an electronic apparatus.

According to an aspect of the invention, the optical characteristics of an electro-optical element change in accordance with electric energy, and a current-driven light-emitting element may be used as the electro-optical element. Such a light-emitting element may be a light-emitting diode, such as an OLED element or an inorganic light-emitting diode. In addition, a field emission device (FED), a surface-conduction emission device (SED), or a ballistic electron surface emission device (BSD) may be used as the electro-optical element.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
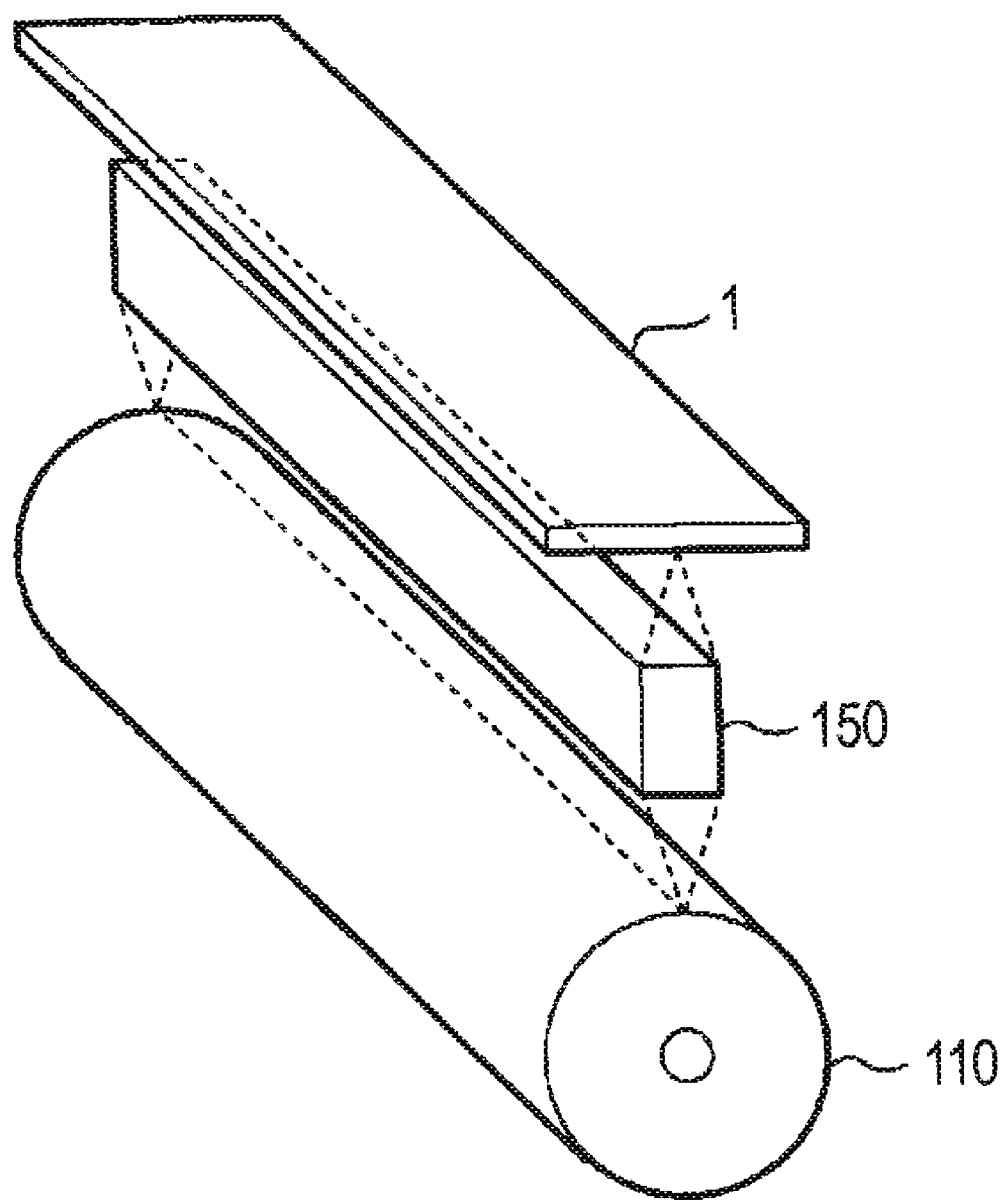
FIG. 1 is a perspective view showing part of an image forming apparatus including an optical head according to a first embodiment of the invention.

Embodiments of the invention will be described with reference to the drawings. In the drawings, the same component parts are referred to as the same reference numerals.

First Embodiment

FIG. 1 is a perspective view showing a configuration of part of an image forming apparatus including an optical head according to a first embodiment. Referring to FIG. 1, the image forming apparatus includes an optical head 1, a light-collecting lens array 150, and a photosensitive drum 110. The optical head 1 includes many electro-optical elements arranged in an array. The optical characteristics of the electro-optical elements change in accordance with electric energy. As electro-optical elements, current-driven light-emitting elements are used. Such light-emitting elements selectively emit light in accordance with an image to be printed on a record member, such as paper. For example, organic light-emitting diodes (OLEDs) are used as light-emitting diodes. The light-collecting lens array 150 is provided between the optical head 1 and the photosensitive dram 110. The light-collecting lens array 150 includes many gradient-index lenses arranged in an array. The optical axis of each of the gradient-index lenses is oriented toward the optical head 1. As the light-collecting lens array 150, for example, a Selfoc trademark of Nippon Sheet Glass Co., Ltd.) lens array (SLA), which is available from Nippon Sheet Glass Co., Ltd., is used. Light emitted from each of the light-emitting elements of the optical head 1 passes through a corresponding gradient-index lens of the light-collecting lens array 150 and reaches the surface of the photosensitive drum 110. Due to the exposure, a latent image corresponding to a desired image is formed on the surface of the photosensitive drum 110.

Figure 2:
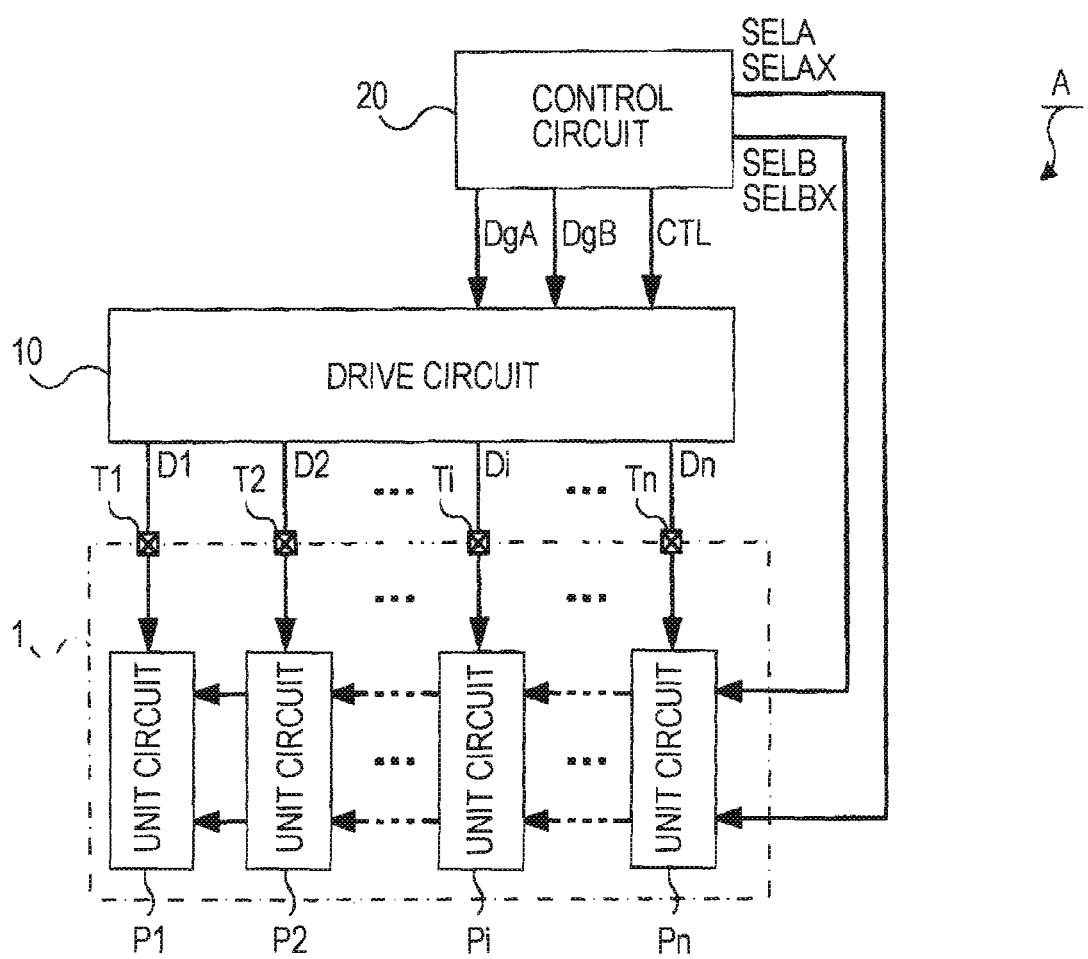
FIG. 2 is a block diagram showing a configuration of an electro-optical device including an optical head.

FIG. 2 is a block diagram showing an electro-optical device A used in the image forming apparatus. The electro-optical device A includes the optical head 1. The electro-optical device A also includes a drive circuit 10 and a control circuit 20, which are peripheral circuits of the optical head 1. The optical head 1 includes n unit circuits P1 to Pn and n input terminals T1 to Tn. The input terminals T1 to Tn are provided in association with the unit circuits P1 to Pn. Each of the unit circuits P1 to Pn includes an OLED element.

The control circuit 20 generates a control signal CTL for controlling the drive circuit 10. The control circuit 20 also generates a first selection signal SELA, a second selection signal SELB, an inverted first selection signal SELAX, and an inverted second selection signal SELBX for controlling the unit circuits P1 to Pn. The control circuit 20 also generates 3-bit first grayscale data DgA and 3-bit second grayscale data DgB for designating the grayscale level of each of the OLED elements. The grayscale level of an OLED element is designated in accordance with the sum of the first grayscale data DgA and the second grayscale data Dgb. The inverted first selection signal SELAX is obtained by inverting the logical level of the first selection signal SELA, and the inverted second selection signal SELBX is obtained by inverting the logical level of the second selection signal SELB.

The drive circuit 10 generates, in accordance with the first grayscale data DgA and the second grayscale data DgB, data signals D1 to Dn to be allocated to the unit circuits P1 to Pn, respectively. The ith ($1 \leq i \leq n$) data signal Di is obtained by rearranging bits of the first grayscale data DgAi and bits of the second grayscale data DgBi. Thus, the ith data signal Di includes the two pieces of data subjected to time-division multiplexing. The unit circuit Pi generates a first pulse-width modulation signal PWM1 and a second pulse-width modulation signal PWM2 in accordance with the data signal Di.

Figure 3:
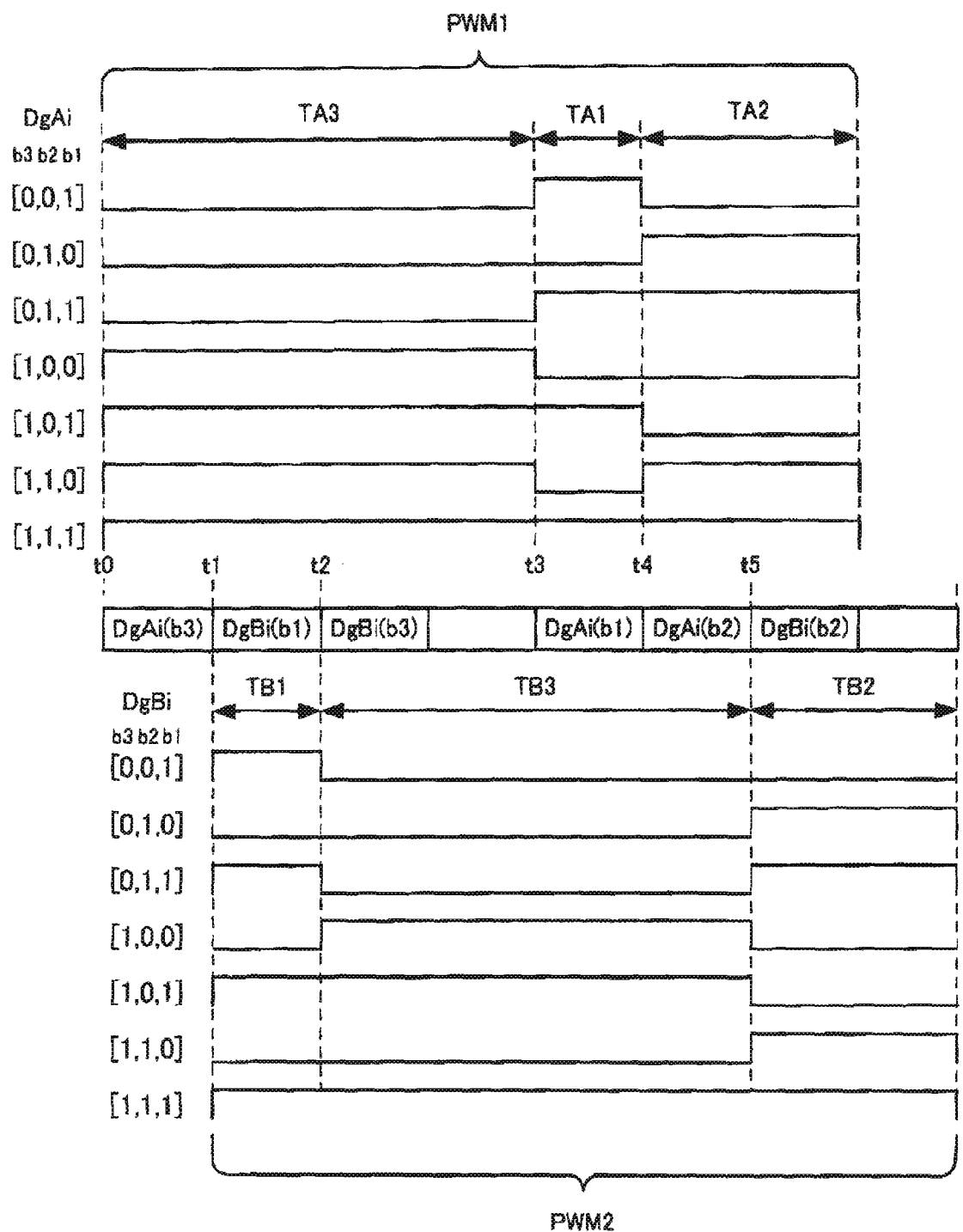
FIG. 3 is a timing chart showing the relationship among first grayscale data, second grayscale data, a data signal, a first pulse-width modulation signal, and a second pulse-width modulation signal.

FIG. 3 shows the relationship among the first grayscale data DgAi, the second grayscale data DgBi, the data signal Di, the first pulse-width modulation signal PWM, and the second pulse-width modulation signal PWM2. The first pulse-width modulation signal PWM1 has sections TA1, TA2, and TA3. In accordance with the logical level of each of the sections, a pulse width represents seven grayscale levels. The lengths of the sections TA1, TA2, and TA3 correspond to the weights of the bits b1, b2, and b3 of the first grayscale data DgAi, respectively. That is, the ratio of the lengths of the sections TA1:TA2:TA3 is 1:2:4. The same applies to the relationship among the second grayscale data DgBi, the second pulse-width modulation signal PWM2, and the sections TB1, TB2, and TB3.

A transition between sections is performed at a different timing for each of the first pulse-width modulation signal PWM1 and the second pulse-width modulation signal PWM2. In this example, the section TB2 ends and the section TB1 starts at time t1, the section TB1 ends and the section TB3 starts at time t2, the section TA3 ends and the section TA1 starts at time t3, the section TA1 ends and the section TA2 starts at time t4, and the section TB3 ends and the section TB2 starts at time t5.

At the beginning of each of the sections TA1 to TA3 and T31 to TB3, the logical level of the data signal Di is set to be equal to the logical level of the first pulse-width modulation signal PWM1 or the second pulse-width modulation signal PWM2 in the corresponding section. In this example, the weights of the bits b1 to b3 of the first grayscale data DgAi and the weights of the bits b1 to b3 of the second grayscale data DgBi correspond to the lengths of the sections TA1 to TA3 and the lengths of the sections TB1 to TB3, respectively. Thus, the data signal Di is generated by rearranging the bits b1 to b3 of the first grayscale data DgAi and the bits b1 to b3 of the second grayscale data DgBi.

More specifically, the logical level of the data signal Di is set to the bit b3 of the first grayscale data DgAi at time t0 at which the section TA3 starts, set to the bit b1 of the second grayscale data DgBi at time t1 at which the section TB1 starts, set to the bit b3 of the second grayscale data DgBi at time t2 at which the section TB3 starts, set to the bit b1 of the first grayscale data DgAi at time t3 at which the section TA1 starts, set to the bit b2 of the first grayscale data DgAi at time t4 at which the section TA2 starts, and set to the bit b2 of the second grayscale data DgBi at time t5 at which the section TB2 starts.

Since the data signal Di is generated by multiplexing the first grayscale data DgAi and the second grayscale data DgBi, the number of wiring lines used for transmitting the data signal Di can be reduced. In addition, at the beginning of each of the sections TA1 to the TA3 and TB1 to TB3, the logical level of the data signal Di is set to be equal to the logical level of the first pulse-width modulation signal PWM1 or the second pulse-width modulation signal PWM2 in the corresponding section. Thus, in order to generate the first pulse-width modulation signal PWM1 from the data signal Di, the data signal Di is latched at the beginning of each of the sections TA1 to TA3 and held until the beginning of the next section. Accordingly, the first pulse-width modulation signal PWM1 and the second pulse-width modulation signal PWM2 can be easily generated from the data signal Di.

Figure 4:
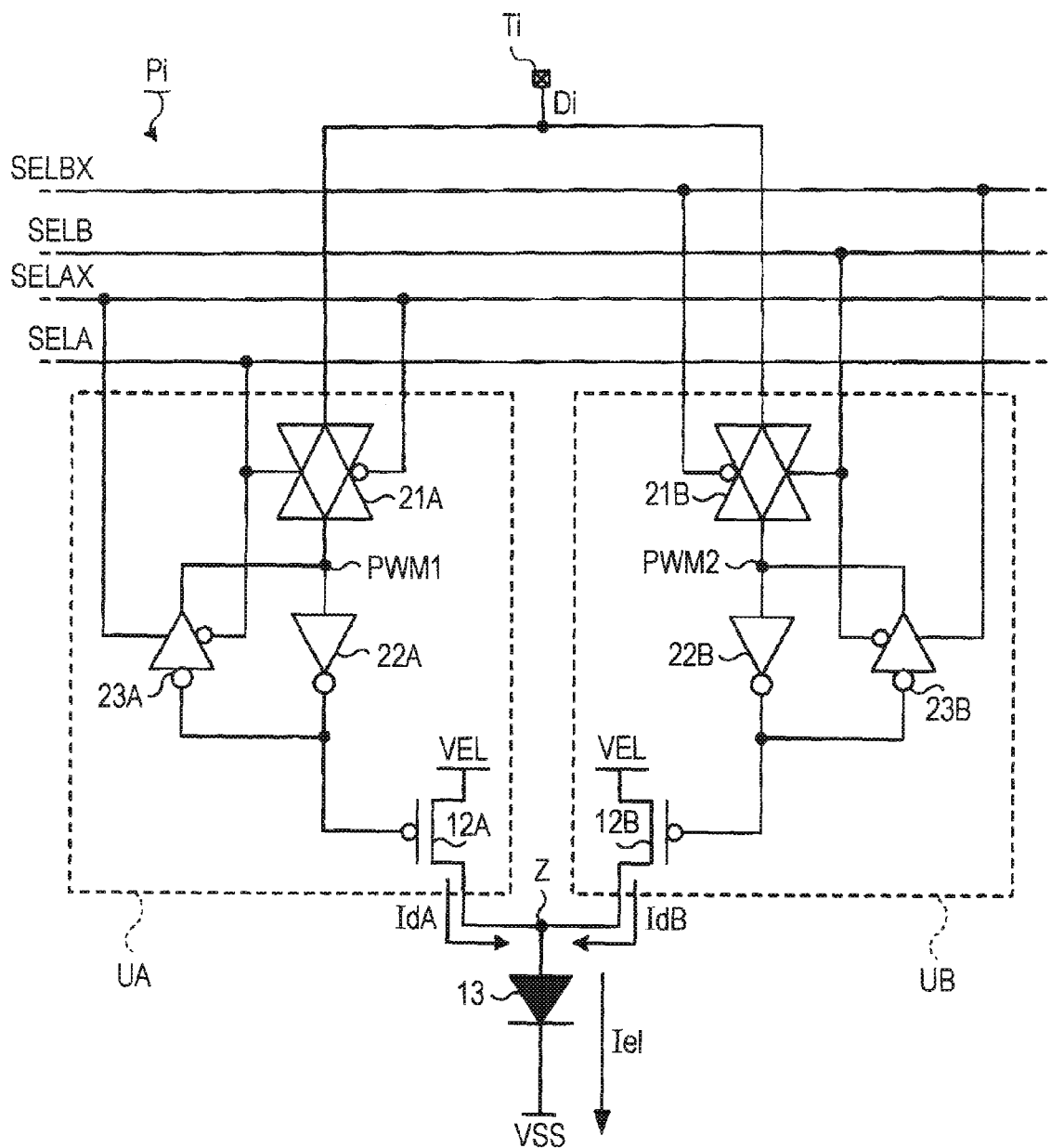
FIG. 4 is a circuit diagram showing a configuration of an ith pixel circuit.

FIG. 4 is a circuit diagram showing the ith unit circuit Pi. The other unit circuits are configured similarly. The unit circuit Pi includes a first processing unit UA, a second processing unit UB, and an OLED element 13. The first processing unit UA generates a first current IdA, and the second processing unit UB generates a second current IdB. The first current IdA and the second current IdB are combined at a connection point Z, and the combined current is supplied as a drive current Iel to the OLED element 13. In this embodiment, the OLED element 13 is PWM-driven by a plurality of systems, that is, the first current IdA and the second current IdB.

Figure 5:
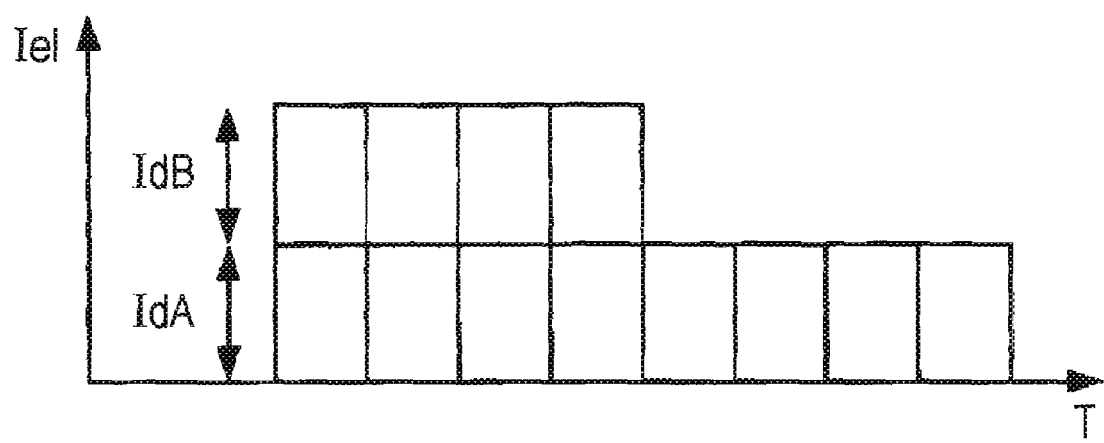
FIG. 5 is a conceptual diagram showing the relationship among a drive current, a first current, and a second current.

As shown in FIG. 5, the drive current Iel is obtained by combining the pulse-width-modulated first current IdA and the pulse-width-modulated second current IdB. Each of the first current IdA and the second current IdB is a current subjected to pulse-width modulation. In the PWM driving method, the number of grayscale levels can be increased by reducing the width of a pulse. However, a certain restriction is imposed on the operation frequency of a circuit. In this embodiment, since the drive current Iel is generated by combining a plurality of pulse-width-modulated currents, the operation frequency of a circuit necessary for acquiring a predetermined number of grayscale levels can be reduced. In this example, the first current IdA when a driving transistor 12A is in the ON-state is equal to the second current IdB when a driving transistor 12B is in the ON-state.

Referring back to FIG. 4, the first processing unit UA includes a transfer gate 21A, an inverter 22A, a clocked inverter 23A, and the driving transistor 12A. The transfer gate 21A receives the first selection signal SELA and the inverted first selection signal SELAX. When the first selection signal SELA becomes active (reaches the high level), the data signal Di is captured into the first processing unit UA. The clocked inverter 23A functions as an inverter when the first selection signal SELA is inactive, and causes an output terminal to have a high impedance when the first selection signal SELA is active. Thus, the inverter 22A and the clocked inverter 23A function as a latch circuit when the first selection signal SELA is inactive. Thus, the data signal Di captured when the first selection signal SELA is active is held during the period in which the first selection signal SELA is inactive.

As described above, the data signal Di is a signal obtained by rearranging and multiplexing bits of the first grayscale data DgAi and bits of the second grayscale data DgBi. The first selection signal SELA indicates a timing at which each bit of the first grayscale data DgAi is multiplexed into the data signal Di, and the second selection signal SELB indicates a timing at which each bit of the second grayscale data DgBi is multiplexed into the data signal Di. In other words, the first selection signal SELA is a signal indicating a timing at which each of the sections TA1, TA2, and TA3 of the first pulse-width modulation signal PWM1 starts, and the second selection signal SELB is a signal indicating a timing at which each of the sections TB1, TB2, and TB3 of the second pulse-width modulation signal PWM2 starts.

The logical level of a signal output from the inverter 22A is set such that the driving transistor 12A is turned off when the output signal is at the high level and such that the driving transistor 12A is turned on when the output signal is at the low level. When the driving transistor 12A is ON, the driving transistor 12A operates in a saturation region. The second processing unit UB is configured similarly to the first processing unit UA with the exception that the second processing unit UB operates using the second selection signal SELB and the inverted second selection signal SELBX, instead of using the first selection signal SELA and the inverted first selection signal SELAX.

Figure 6:
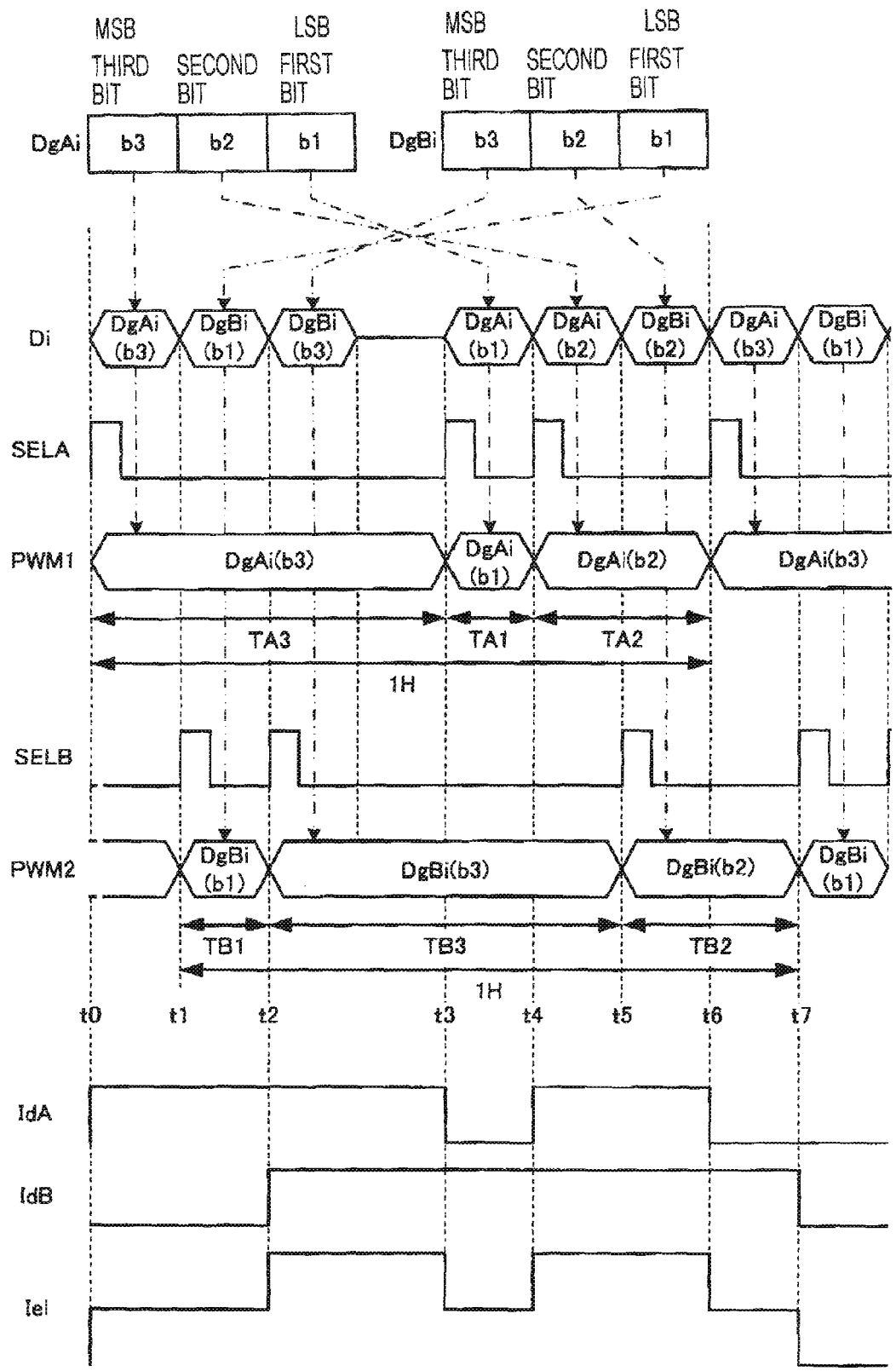
FIG. 6 is a timing chart showing an operation of a unit circuit.

FIG. 6 illustrates waveforms showing an operation of the unit circuit Pi. "1H" represents a period in which the first current IdA corresponding to the first grayscale data DgAi or the second current IdB corresponding to the second grayscale data DgBi is generated.

As shown in FIG. 6, the first selection signal SELA shifts from the low level to the high level at time t0 and time t6 at which the section TA3 starts, at time t3 at which the section TA1 starts, and at time t4 at which the section TA2 starts. The first selection signal SELA is kept at the high level during a predetermined period of time, and then, shifted to the low level. When the first selection signal SELA is at the high level, the transfer gate 21A is in the ON-state and the data signal Di is captured into the first processing unit UA. Accordingly, the first pulse-width modulation signal PWM1 is generated, as shown in FIG. 6. "0" is written in the data signal Di at time t5.

The second selection signal SELB is shifted from the low level to the high level at time t1 and time t7 at which the section TB1 starts, at time t2 at which the section TB3 starts, and at time t5 at which the section TB2 starts. The second selection signal SELB is kept at the high level during a predetermined period of time, and then, shifted to the low level. When the second selection signal SELB is at the high level, a transfer gate 21B is in the ON-state and the data signal Di is captured into the second processing unit UB. Accordingly, the second pulse-width modulation signal PWM2 is generated, as shown in FIG. 6. "0" is written in the data signal Di at time t7.

For example, when the data value of each of the first grayscale data DgAi and the second grayscale data DgBi is [1,1, 0], the first current IdA and the second current IdB have waveforms shown in FIG. 6. Since the drive current Iel is obtained by adding the first current IdA and the second current IdB, the drive current Iel has a waveform having recesses and projections, as shown in FIG. 6.

In the foregoing embodiment, two pieces of data are multiplexed with each other to generate the data signal Di. However, three or more pieces of data are multiplexed with each other to generate three or more pulse-width modulation signals.

In addition, in the foregoing embodiment, the amplitude of the first current IdA is equal to the amplitude of the second current IdB. However, the amplitude of the first current IdA may be different from the amplitude of the second current IdB. In addition, the number of bits of the first grayscale data DgA may be different from the number of bits of the second grayscale data DgB.

In addition, in the foregoing embodiment, the first grayscale data DgA is allocated to the first current IdA, and the second grayscale data DgB is allocated to the second current IdB. However, grayscale data Dg indicating the grayscale level to be displayed at the OLED element 13 may be allocated to the first current IdA, and correction data Dh may be allocated to the second current IdB. The correction data Dh is used for correcting variations in a threshold voltage Vth of each of the driving transistors 12A and 12B and in the light emission characteristics of the OLED element 13, In this case, the drive circuit 10 includes a memory in which correction data Dh1 to Dhn are stored in advance for the corresponding unit circuits P1 to Pn. Thus, the data signals D1 to Dn can be generated in accordance with the grayscale data Dg1 to Dgn and the correction data Dh1 to Dhn to be allocated to the unit circuits P1 to Pn, respectively.

In this example, the data signal Di shown in FIG. 6 is configured such that the first grayscale data DgAi (the bit b3) is disposed after the second grayscale data DgBi (the bit b2). However, instead of the first grayscale data DgAi (the bit b3), an end pulse EP1 may be inserted. The end pulse EP1 is a signal indicating termination of transmission of the first grayscale data DgAi, and the end pulse EP1 is set to have a logical level at which the pulse width modulation signal PWM1 is inactive. In addition, after the end pulse EP1, an end pulse EP2 may be inserted. The end pulse EP2 is a signal indicating termination of transmission of the second grayscale data DgBi. The end pulse EP2 is set to have a logical level at which the second pulse-width modulation signal PWM2 is inactive. The end pulses EP1 and EP2 function such that the logical levels held by the first pulse-width modulation signal PWM1 and the second pulse-width modulation signal PWM2 in the first processing unit UA and the second processing unit UB are used as reset signals. In this example, only a reset signal is inserted at the end of transmission of grayscale data, and there is no need to transmit a reset signal at the end of the section TA3 or TA1 and at the end of the section TB1 or TB3. Thus, the transfer rate of the data signal Di can be reduced.

Second Embodiment

Figure 7:
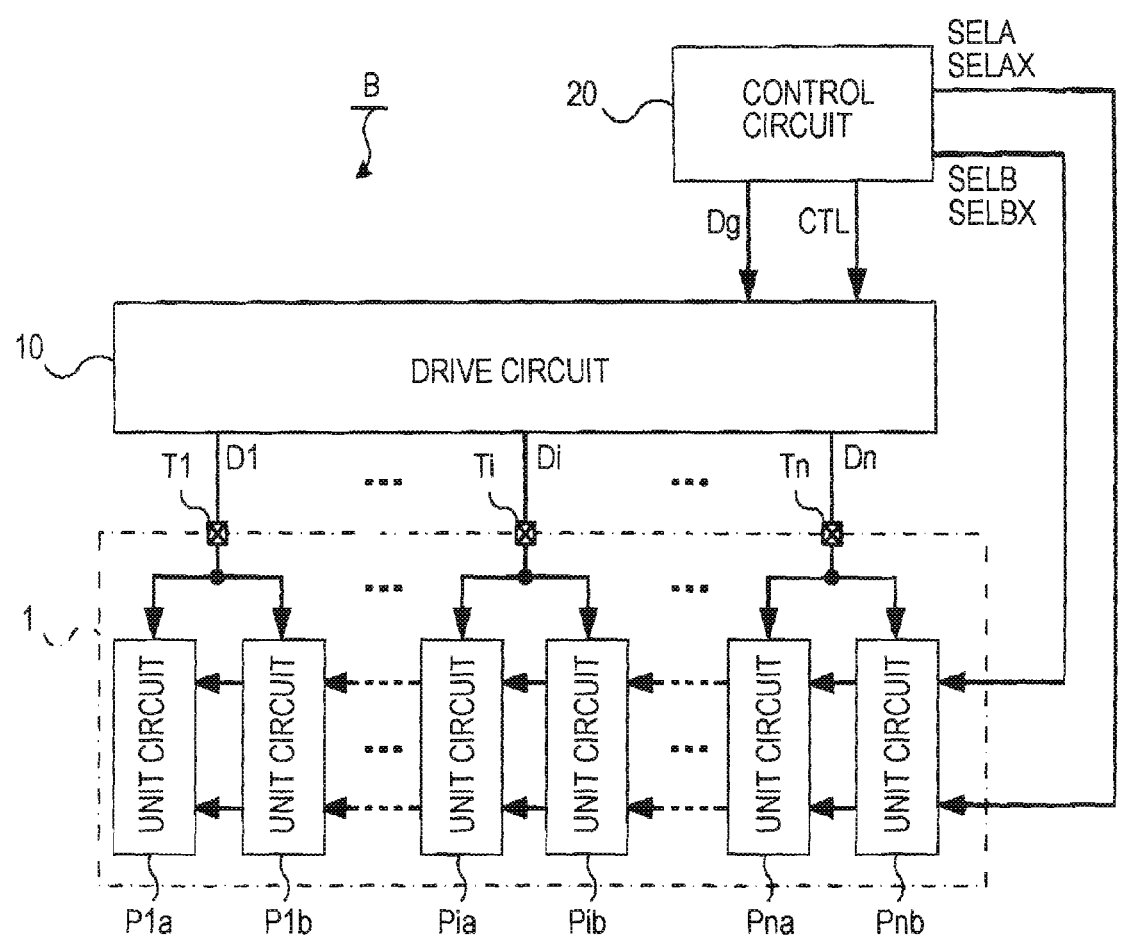
FIG. 7 is a block diagram showing a configuration of an electro-optical device according to a second embodiment of the invention.
Figure 8:
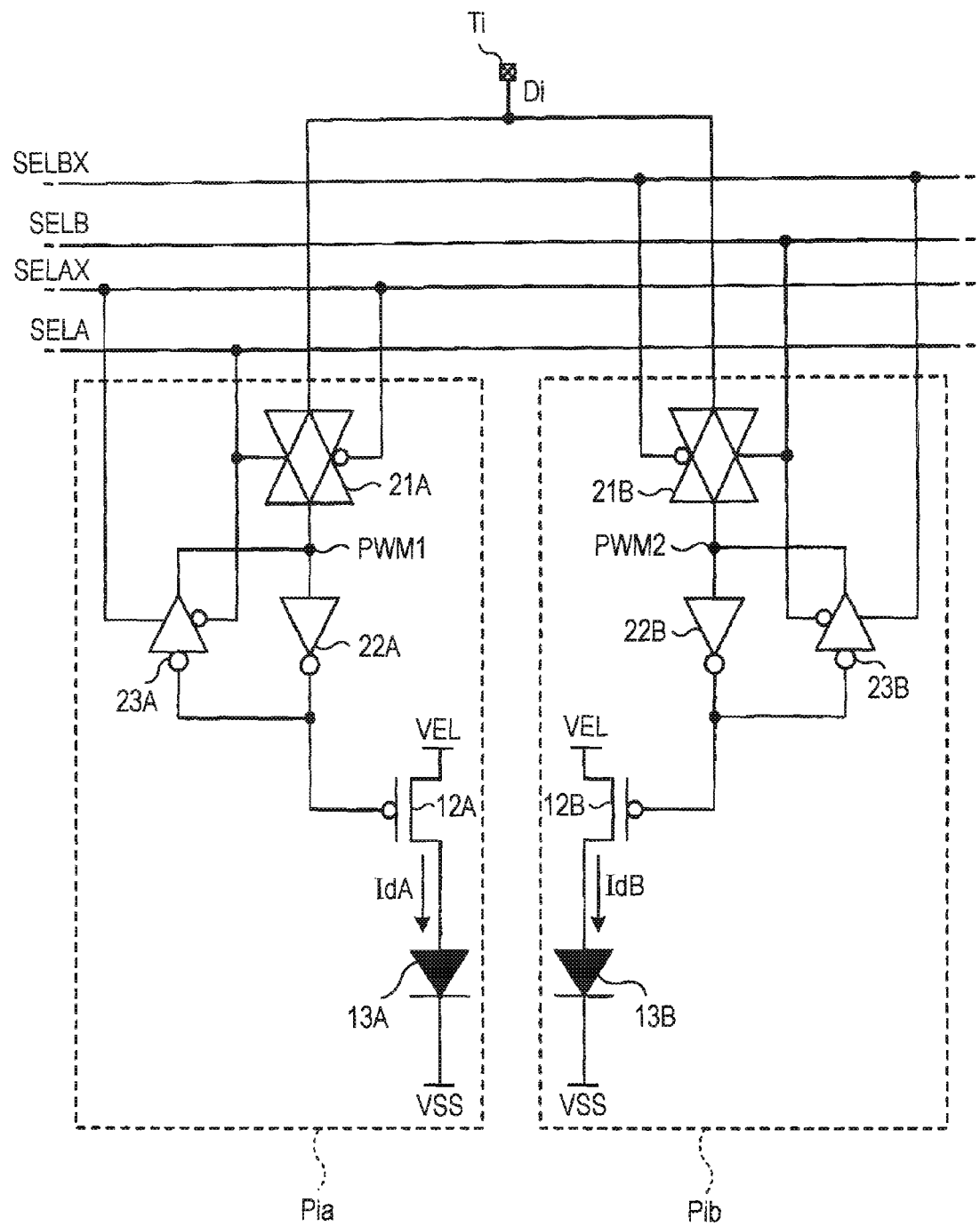
FIG. 8 is a circuit diagram showing configurations of unit circuits.

FIG. 7 is a block diagram showing an electro-optical device B according to a second embodiment. The electro-optical device B includes the optical head 1 including 2n unit circuits, that is, unit circuits P1a and P1b, ..., and unit circuits Pna and Pnb. FIG. 8 is a circuit diagram showing the unit circuits Pia and Pib. The unit circuits Pia and Pib are different from the unit circuit Pi used in the first embodiment in that each of the unit circuits Pia and Pib includes the OLED element 13. In the first embodiment, the grayscale level of an OLED element is acquired from the sum of the first grayscale data DgAi and the second grayscale data DgBi. In the second embodiment, however, the first grayscale data DgAi designates the luminance of an OLED element 13A of the unit circuit Pia, and the second grayscale data DgBi designates the luminance of an OLED element 13B of the unit circuit Pib. In this case, the transfer gates 21A and 21B function as demultiplexers for separating the data signal Di into the first grayscale data DgAi and the second grayscale data DgBi.

Since the data signal Di including the first grayscale data DgAi and the second grayscale data DgBi that are multiplexed with each other is transmitted as described above, the number of input terminals T1 to Tn can be reduced, thus narrowing the pitches between the input terminals. In addition, the number of wiring lines used for transmitting the data signals D1 to Dn can be reduced. In this embodiment, in the data signal Di, a logical level of the first pulse-width modulation signal PWM1 and a logical level of the second pulse-width modulation signal PWM2 are multiplexed at the beginning of corresponding sections. Thus, the first pulse-width modulation signal PWM1 and the second pulse-width modulation signal PWM2 can be generated only by capturing the data signal Di at predetermined timings in the unit circuits Pia and Pib and holding the captured data signal Di.

Third Embodiment

Figure 9:
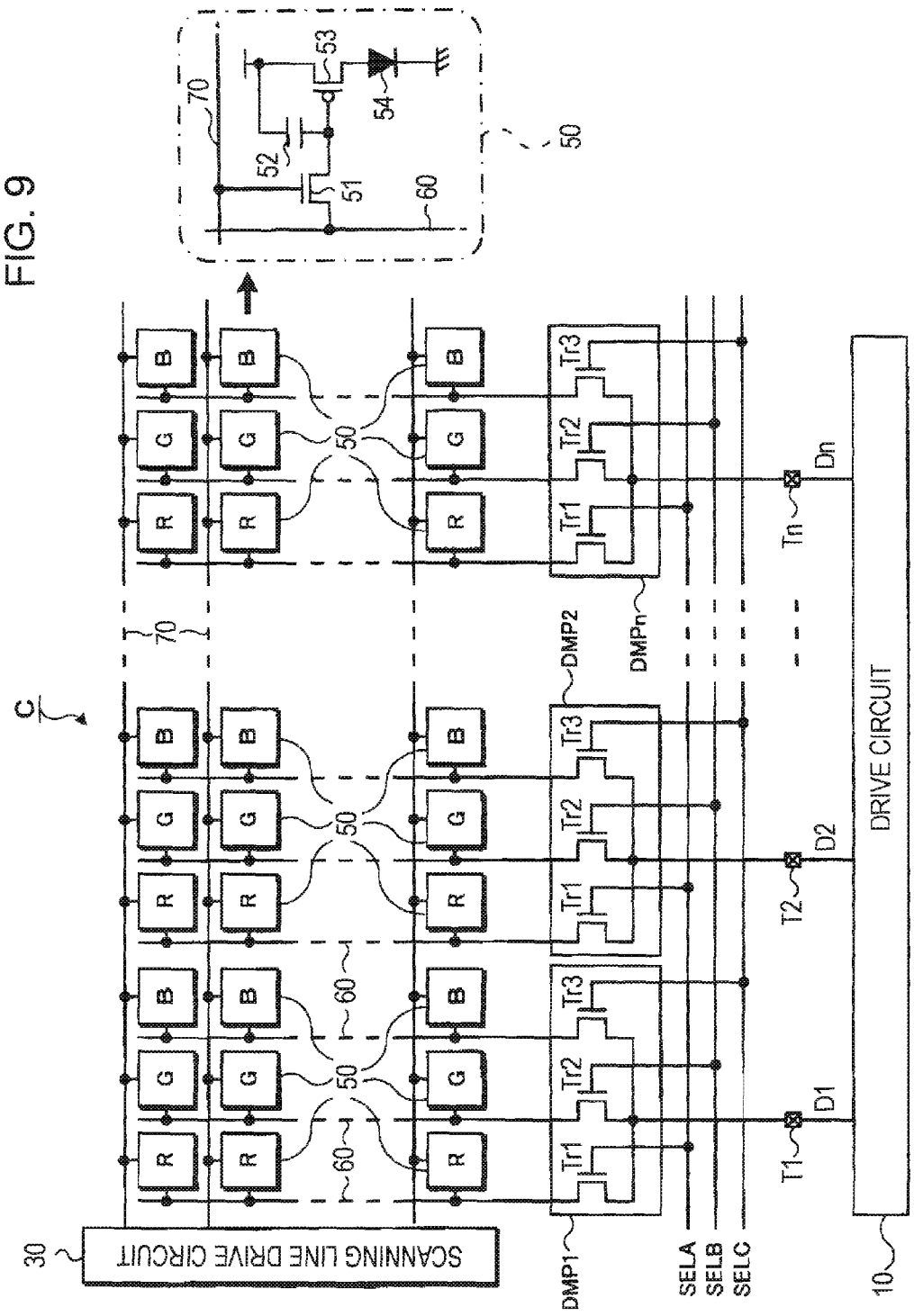
FIG. 9 is a block diagram showing a configuration of an electro-optical device according to a third embodiment of the invention.

FIG. 9 is a block diagram showing an electro-optical device C according to a third embodiment. The electro-optical device C is used as a display device.

The electro-optical device C includes 3n data lines 60 and m scanning lines 70. Pixel circuits 50 are arranged in a matrix in association with intersections of the data lines 60 and the scanning lines 70. In FIG. 9, each of the pixel circuits 50 represented by "R" includes an OLED element 54 that emits red light, each of the pixel circuits 50 represented by "B" includes the OLED element 54 that emits blue light, and each of the pixel circuits 50 represented by "G" includes the OLED element 54 that emits green light.

The drive circuit 10 generates data signals by performing time-division multiplexing of R grayscale data Dr, B grayscale data Db, and G grayscale data Dg. The drive circuit 10 supplies the generated data signals to demultiplexers DMP1 to DMPn via the input terminals T1 to Tn. A scanning line drive circuit 30 sequentially selects the m scanning lines 70. The scanning line drive circuit 30 supplies a scanning signal to the selected scanning line 70. The demultiplexers DMP1 to DMPn each including transistors Tr1, Tr2, and Tr3 are provided at ends of the data lines 60. The transistors Tr1, Tr2, and Tr3 are turned on or turned off in accordance with selection signals SELA to SELC. The selection signals SELA to SELC exclusively become active (high level). Thus, a data signal is distributed to three data lines 60. Thus, signals corresponding to the R grayscale data Dr, the B grayscale data Db, and the G grayscale data Dg are supplied to the corresponding data lines 60.

Each of the pixel circuits 50 includes a driving transistor 53 and an OLED element 54. A capacitor 52 is connected between the gate and source of the driving transistor 53. The third embodiment is similar to the first and second embodiment in that the OLED element 54 is PWM driven. The OLED element 54 is turned on or turned off in accordance with the gate potential of the driving transistor 53. The capacitor 52 functions as a unit to hold the gate potential, and corresponds to the latch circuit described above (that is, the inverter 22A and the clocked inverter 23A). When a scanning signal supplied via the corresponding scanning line 70 becomes active, a transistor 51 is turned on so that a signal supplied via the corresponding data line 60 is written to the capacitor 52. Each of the demultiplexers DMP1 to DMPn corresponds to the transfer gate 21A. A gate potential subjected to pulse-width modulation is supplied to the gate of the driving transistor 53 of each of the pixel circuits 50. The gate potential of the "R" pixel circuits 50 corresponds to a first pulse-width modulation signal. The gate potential of the "G" pixel circuits 50 corresponds to a second pulse-width modulation signal. The gate potential of the "B" pixel circuits 50 corresponds to a third pulse-width modulation signal. The data signal D1 is acquired by multiplexing the logical levels of the first to third pulse-width modulation signals at the beginning of corresponding sections. Thus, when the demultiplexer DMP1 captures the data signal D1 at a predetermining timing and the capacitor 52 holds the data signal D1, the pixel circuits 50 are capable of generating the first to third pulse-width modulation signals.

Modifications

The invention is not limited to the foregoing embodiments. For example, the following modifications are available.

In the foregoing embodiments, in systems for generating a first pulse-width modulation signal PWM1 and a second pulse-width modulation signal PWM2, a data signal Di is latched at the beginning of corresponding sections for the corresponding systems, and the data signal Di is held until the beginning of the next corresponding sections for the corresponding systems. Accordingly, the first and second pulse-width modulation signals PWM1 and PWM2 can be generated. However, the invention is not limited to this. A reset bit (that is, a reset signal) indicating termination of a section may be inserted in the data signal Di so that holding of data is terminated in accordance with the reset bit.

Figure 10:
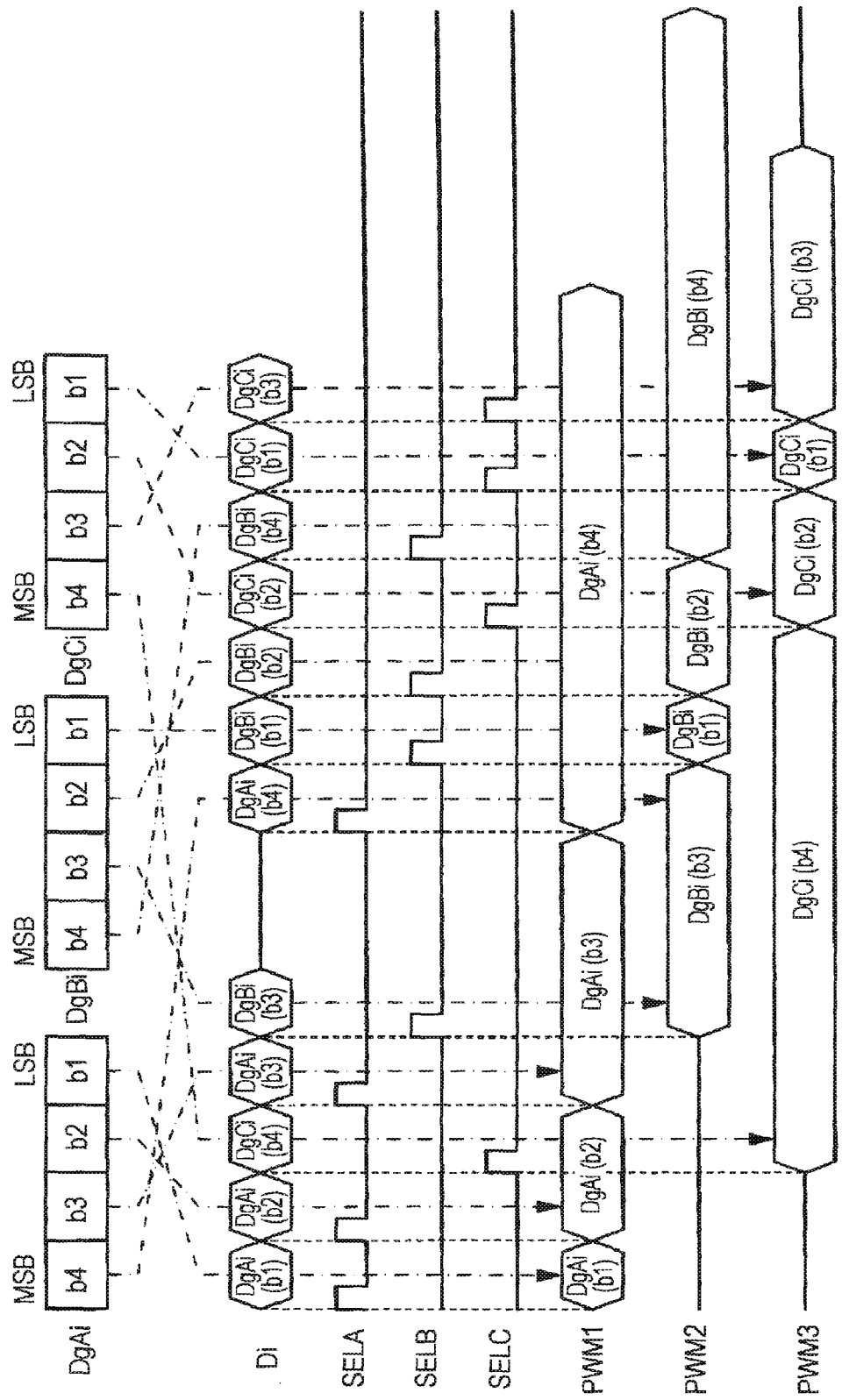
FIG. 10 is a timing chart for explaining multiplexing according to a modification.

Three or more signals may be multiplexed with each other. For example, first grayscale data DgA, second grayscale data DgB, and third grayscale data DgC may be multiplexed with each other. FIG. 10 shows an example of multiplexing. In this example, each of the grayscale data DgA, DgB, and DgC has four bits.

Sections of a first pulse-width modulation signal PWM1, a second pulse-width modulation signal PWM2, and a third pulse-width modulation signal PWM3 start at different timings for each of the first to third pulse-width modulation signals PWM3. In the data signal Di, bits of the first to third grayscale data DgA, DgB, and DgC for the beginning of corresponding sections are rearranged. In this example, the first bit of the first grayscale data DgAi, the second bit of the first grayscale data DgAi, the fourth bit of the third grayscale data DgCi, the third bit of the first grayscale data DgAi, the third bit of the second grayscale data DgBi, the fourth bit of the first grayscale data DgAi, the first bit of the second grayscale data DgBi, the second bit of the second grayscale data DgBi, the second bit of the third grayscale data DgCi, the fourth bit of the second grayscale data DgBi, the first bit of the third grayscale data DgCi, and the third bit of the third grayscale data DgCi are rearranged in that order.

The data signal Di is separated into three systems in accordance with the first to third selection signals SELA to SELC, and the separated data signal Di is held during a period from the beginning of a section to the beginning of the next section in the corresponding systems. Accordingly, the first to third pulse-width modulation signals PWM1 to PWM3 can be generated.

Image Forming Apparatus

As shown in FIG. 1, the optical head 1 is used as a line-layout optical head for writing a latent image into an image carrier in an image forming apparatus adopting an electrophotographic method. For example, the image forming apparatus may be a printer, a printing section of a copying machine, or a printing section of a facsimile machine.

FIG. 10 shows a longitudinal section of an image forming apparatus including the optical head 1. This image forming apparatus is a tandem-type full-color image forming apparatus adopting a belt intermediate transfer body method.

In the image forming apparatus, four organic EL array exposing heads 1K, 1C, 1M, and 1Y having the same configuration are arranged at exposure positions of four corresponding photosensitive drums (image carriers) 110K, 11C, 110M, and 110Y having the same configuration. The organic EL array exposing heads 1K, 1C, 1M, and 1Y are the optical head 1 according to any one of the foregoing embodiments.

Figure 11:
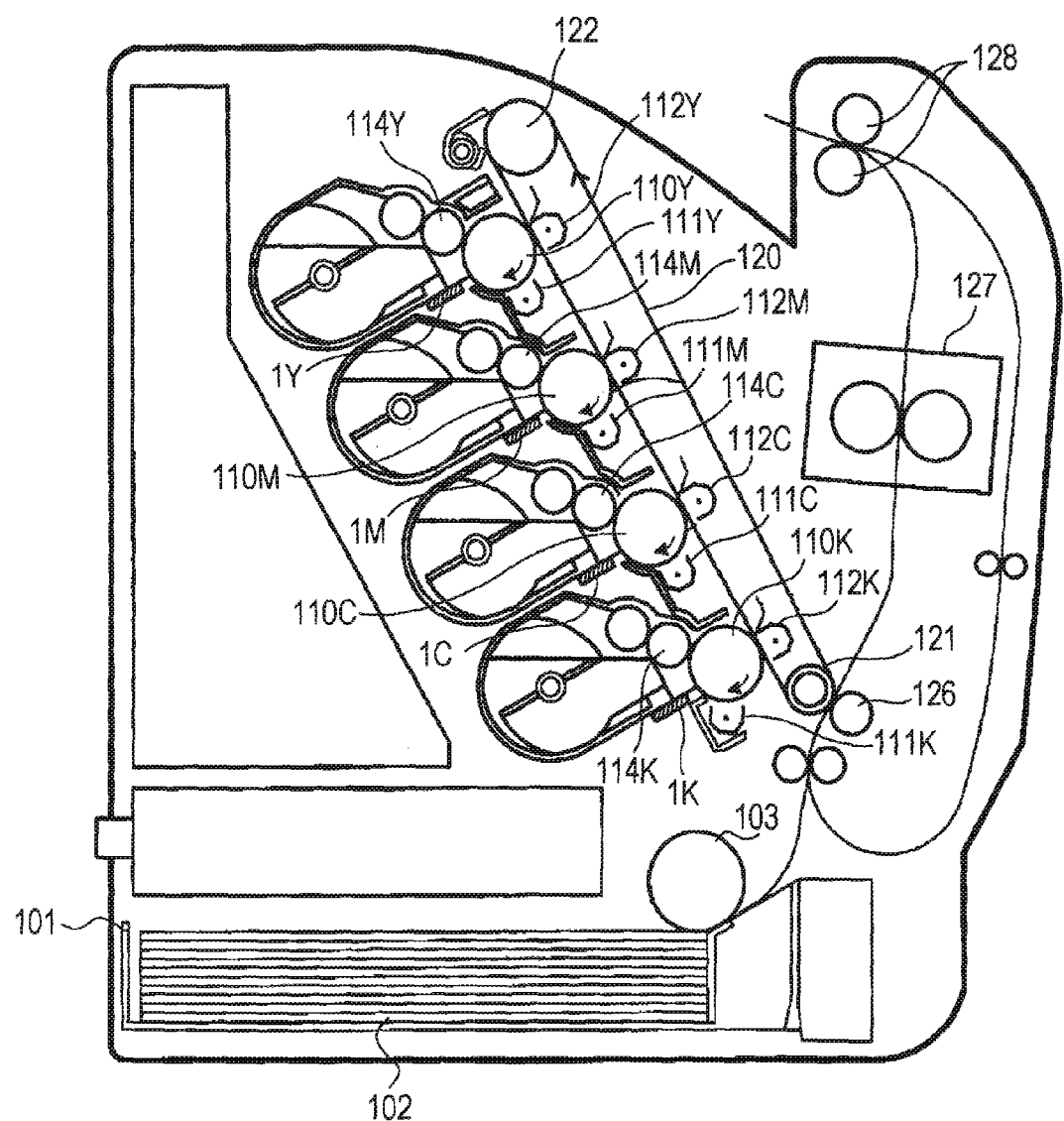
FIG. 11 shows a longitudinal section of an image forming apparatus utilizing an electro-optical device according to an embodiment of the invention.

Referring FIG. 11, the image forming apparatus includes a driving roller 121 and a follower roller 122. An endless intermediate transfer belt 120 is wound around the driving roller 121 and the follower roller 122 so as to be rotated around the driving roller 121 and the follower roller 122, as indicated by an arrow. Although not illustrated, the image forming apparatus may include a tension-applying unit, such as a tension roller, that applies tension to the intermediate transfer belt 120.

The photosensitive drums 110K, 110C, 110M, and 110Y each having a photosensitive layer on the outer peripheral surface thereof are disposed at a predetermined distance from each other around the intermediate transfer belt 120. The suffixes "K", "C", "M", and "Y" mean that the photosensitive drums are used for forming visualized images in black, cyan, magenta, and yellow, respectively. The same applies to the other members. The photosensitive drums 110K, 110C, 110M, and 110Y are driven to be rotated in synchronization with driving of the intermediate transfer belt 120.

Corona charging units 111 (K, C, M, and Y), the organic EL array exposing heads 1 (K, C, M, and Y), and developing units 114 (K, C, M, and Y) are provided around the corresponding photosensitive drums 110 (K, C, M, and Y). The corona charging units 111 (K, C, M, and Y) uniformly charge the outer peripheral surfaces of the corresponding photosensitive drums 110 (K, C, M, and Y). The organic EL array exposing heads 1 (K, C, M, and Y) write electrostatic latent images on the charged outer peripheral surfaces of the corresponding photosensitive drums. The organic EL array exposing heads 1 (K, C, M, and Y) are arranged such that the direction of arrangement of a plurality of OLED elements P is aligned with the generatrix (main-scanning direction) of the photosensitive drums 110 (K, C, M, and Y). Electrostatic latent images are written by irradiating the photosensitive drums with beams from the plurality of OLED elements. The developing units 114 (K, C, M, and Y) deposit toner as developer on the electrostatic latent images so that visualized images, that is, visible images, are formed on the corresponding photosensitive drums.

The visualized images of black, cyan, magenta, and yellow formed by the four single-color visualized image forming stations are primarily transferred sequentially onto the intermediate transfer belt 120. Thus, the visualized images are superimposed on each other on the intermediate transfer belt 120. As a result, a full-color visualized mage is obtained. Four primary transfer corotrons (transferring units) 112 (K, C, M, and Y) are arranged inside the intermediate transfer belt 120. The primary transfer corotrons 112 (K, C, M, and Y) are arranged in the vicinity of the photosensitive drums 110 (K, C, M, and Y), respectively. Visualized images are electrostatically attracted from the photosensitive drums 110 (K, C, M, and Y) so as to be transferred to the intermediate transfer belt 120 passing between the photosensitive drums and the primary transfer corotrons.

A sheet 102 on which an image is to be finally formed is fed one by one from a sheet feed cassette 101 by a pickup roller 103, and then transmitted to a nip between the intermediate transfer belt 120 abutting the driving roller 121 and a secondary transfer roller 126. The full-color visualized image on the intermediate transfer roller 120 is secondarily transferred onto one side of the sheet 102 all at once by the secondary transfer roller 126, and then passes between a pair of fixing rollers 127 serving as a fixing unit to be fixed on the sheet 102. Then, the sheet 102 is discharged onto a sheet discharge cassette, which is formed on an upper portion of the image forming apparatus, by a pair of sheet discharge rollers 128.

An image forming apparatus according to another embodiment of the invention will now be described.

Figure 12:
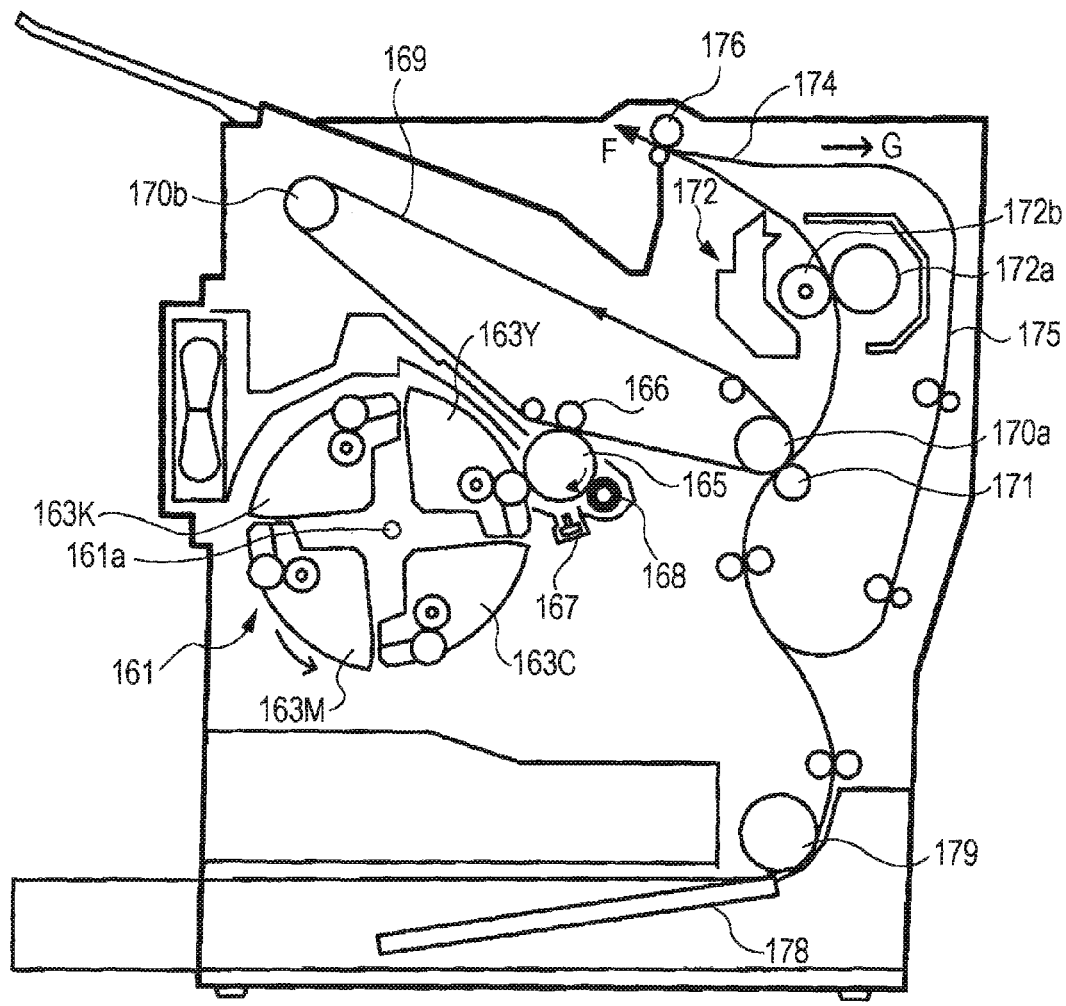
FIG. 12 shows a longitudinal section of an image forming apparatus including an electro-optical device according to another embodiment of the invention.

FIG. 12 shows a longitudinal section of another image forming apparatus including the optical head 1. This image forming apparatus is a rotary-development-type full-color image forming apparatus adopting a belt intermediate transfer body method. Referring to FIG. 12, in the image forming apparatus, a corona charging unit 168, a rotary developing device 161, an organic EL array exposing head 167, and an intermediate transfer belt 169 are provided around a photosensitive drum 165.

The corona charging unit 168 uniformly charges an outer peripheral surface of the photosensitive drum 165. The organic EL array exposing head 167 writes an electrostatic latent image on the charged outer peripheral surface of the photosensitive drum 165. The organic EL array exposing head 167, which is the above-described optical head 1, is arranged such that the direction of the arrangement of a plurality of light-emitting elements is aligned with the generatrix (main-scanning direction) of the photosensitive drum 165. The electrostatic latent image is written by irradiating photosensitive drum 165 with light from the plurality of light-emitting elements.

The developing device 161 is a drum in which four developing units 163Y, 163C, 163M, and 163K are arranged at intervals of 90 degrees, and is rotatable around a shaft 161a counterclockwise. The developing units 163Y, 163C, 163M, and 163K supply yellow, cyan, magenta and black toners to the photosensitive drum 165, respectively, to deposit the toners as developer on an electrostatic latent image. Thus, a visualized image, that is, a visible image is formed on the photosensitive dram 165.

The endless intermediate transfer belt 169 is wound around a driving roller 170a, a follower roller 170b, a primary transfer roller 166, and a tension roller so as to rotate around these rollers in a direction as indicated by an arrow. The primary transfer roller 166 electrostatically attracts a visualized image from the photosensitive drum 165 to transfer the visualized image to the intermediate transfer belt 169 passing between the photosensitive drum and the primary transfer roller 166.

More Specifically, in the first one turn of the photosensitive drum 165, an electrostatic latent image for a yellow (Y) image is written by the exposing head 167, a visualized image with the same color is formed by the developing unit 163Y, and the visualized image is then transferred to the intermediate transfer belt 169. In the next one turn of the photosensitive drum 165, an electrostatic latent image for a cyan (C) image is written by the exposing head 167, a visualized image with the same color is formed by the developing unit 163C, and the visualized image is then transferred to the intermediate transfer belt 169 so as to be superimposed on the yellow visualized image. While the photosensitive drum 165 makes four turns in this way, visualized images with yellow, cyan, magenta, and black are sequentially superimposed on the intermediate transfer belt 169. As a result, a full-color visualized image is formed on the intermediate transfer belt 169. When visualized images are formed on both sides of a sheet on which the image is to be finally formed, full-color images are formed on the intermediate transfer belt 169 in such a manner that visualized images with the same color are transferred to the front surface and reverse surface of the intermediate transfer belt 169, and then visualized images with the next same color are transferred to the front surface and reverse surface of the intermediate transfer belt 169.

The image forming apparatus includes a sheet conveying path 174 through which a sheet passes. Sheets are withdrawn one by one by a pickup roller 179 from a sheet feed cassette 178, are advanced by a conveying roller along the sheet conveying path 174, and pass through a nip between the intermediate transfer belt 169 abutting the driving roller 170a and a secondary transfer roller 171. The secondary transfer roller 171 electrostatically attracts a full-color visualized image from the intermediate transfer belt 169 all at once to transfer the visualized image to one surface of the sheet. The secondary transfer roller 171 approaches and move away from the intermediate transfer belt 169 by a clutch (not shown). While a full-color image is transferred to a sheet, the secondary transfer roller 171 is brought into abutment with the intermediate transfer belt 169, and while a visualized image is superimposed on the intermediate transfer belt 169, the secondary transfer roller 171 is separated from the intermediate transfer belt.

The sheet to which the visualized image is transferred as described above is conveyed to the fixing unit 172, and then passes between a heating roller 172a and a pressure roller 172b of the fixing unit 172, so that the visualized image on the sheet is fixed. The sheet after the fixing treatment is drawn into a pair of sheet discharge rollers 176 to advance in the direction indicated by an arrow F. In a case of double-sided printing, after most of a sheet passes between the pair of sheet discharge rollers 176, the pair of sheet discharge rollers 176 rotates in a reverse direction so that the sheet is introduced into a conveying path 175 for double-sided printing, as indicated by an arrow G. Then, the visualized image is transferred to the other surface of the sheet by the secondary transfer roller 171. After fixing treatment is performed again in the fixing unit 172, the sheet is discharged via the pair of sheet discharge rollers 176.

Since the image forming apparatus shown in FIG. 11 or FIG. 12 utilizes the OLED element 13 as an exposing element, the image forming apparatus can be miniaturized compared with a case where a laser scan optical system is utilized. In addition, an optical head according to an aspect of the invention may be used in an image forming apparatus other than an electrophotographic image forming apparatus. For example, an optical head according to an aspect of the invention may be used in an image forming apparatus in which a visualized image is directly transferred from a photosensitive drum to a sheet without using an intermediate transfer belt or in an image forming apparatus forming a monochrome image.

In addition, an electro-optical device according to an aspect of the invention may be used in various electronic apparatuses, such as facsimile machines, copying machines, multifunction machines, and printers.

In addition, an electro-optical device is not necessarily a display device including a line-type optical head 1. An electro-optical device may be a display device in which pixel circuits P are arranged in a matrix. An electronic apparatus including such a display device may be, for example, a personal computer, a cellular phone, an electronic still camera, or a video camera including an electronic viewfinder.

What is claimed is:

1. An electro-optical device comprising:
   a plurality of driving transistors turned on or turned off in accordance with a plurality of pulse-width modulation signals each having a plurality of sections for which respective logical levels are set;
   an electro-optical element electrically connected to drains of the plurality of driving transistors and emitting light at a luminance corresponding to a drive current acquired by combining currents supplied from the plurality of driving transistors;
   a data signal generator generating a data signal in accordance with a plurality of pieces of data such that, at the beginning of each of the plurality of sections of the corresponding pulse-width modulation signals, the logical level of the data signal corresponds to the logical level of the corresponding pulse-width modulation signal for the corresponding section; and
   a plurality of pulse-width modulation signal generators provided for the respective driving transistors, each of the plurality of pulse-width modulation signal generators generating a corresponding pulse-width modulation signal by latching the data signal at the beginning of a certain section of the pulse-width modulation signal to be supplied to the corresponding driving transistor and by holding the data signal until the beginning of the next section of the pulse-width modulation signal and supplying the generated pulse-width modulation signal to the corresponding driving transistor.

2. The electro-optical device according to claim 1, wherein each of the plurality of pieces of data includes grayscale data representing the grayscale level of the electro-optical element and correction data for correcting the luminance of the electro-optical element.

3. The electro-optical device according to claim 1,
   wherein each of the plurality of pieces of data includes a plurality of bits, and
   wherein the data signal generator generates the data signal by rearranging the plurality of bits of the respective pieces of data.

4. The electro-optical device according to claim 3, wherein the length of each of the plurality of sections of the pulse-width modulation signals is set in association with the weight of the corresponding bit.

5. An electronic apparatus comprising the electro-optical device set forth in claim 1.

* * * * *